(12) United States Patent
Low et al.

(10) Patent No.: US 6,998,638 B2
(45) Date of Patent: Feb. 14, 2006

(54) TEST STRUCTURE FOR DETECTING BONDING-INDUCED CRACKS

(75) Inventors: Qwai H. Low, Cupertino, CA (US); Ramaswamy Ranganathan, Saratoga, CA (US); Anwar Ali, San Jose, CA (US); Tauman T. Lau, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/856,213

(22) Filed: May 28, 2004

(65) Prior Publication Data

US 2004/0217487 A1    Nov. 4, 2004

Related U.S. Application Data

(63) Continuation of application No. 10/229,601, filed on Aug. 28, 2002, now Pat. No. 6,781,150.

(51) Int. Cl.
  *H01L 23/58*    (2006.01)
(52) U.S. Cl. .................................. 257/48; 257/758
(58) Field of Classification Search .................. 257/48, 257/758, 786, E21.521–E21.523, E23.019, 257/E23.02, 700; 438/14, 15, 18
See application file for complete search history.

(56) References Cited

U.S. PATENT DOCUMENTS 5,818,699 A * 10/1998 Fukuoka .................... 361/760
6,284,080 B1    9/2001 Haq et al. ................. 156/89.16
6,333,557 B1   12/2001 Sullivan ..................... 257/758
6,576,923 B2    6/2003 Satya et al. ................. 257/48
6,844,631 B2 *  1/2005 Yong et al. ................. 257/786

* cited by examiner

*Primary Examiner*—Tom Thomas
*Assistant Examiner*—Matthew C Landau
(74) *Attorney, Agent, or Firm*—Luedeka, Neely & Graham, P.C.

(57) ABSTRACT

An integrated circuit having a crack detection structure. A control structure is formed having interleaved electrically conductive layers and non electrically conductive layers in a vertical orientation. Electrically conductive vias are disposed vertically through all of the non electrically conductive layers, which vias electrically connect all of the electrically conductive layers one to another. A test structure is formed having a bonding pad for probing and bonding, with underlying interleaved electrically conductive layers and non electrically conductive layers disposed in a vertical orientation. At least one of the non electrically conductive layers has no vias formed therein, simulating active circuitry under other bonding pads of the integrated circuit. At least one of the interleaved electrically conductive layers of the control structure extends from within the control structure to within the test structure as a sensing layer. The sensing layer immediately underlies the at least one of the non electrically conductive layers in the test structure that has no vias formed therein. Thus, a crack in the at least one of the non electrically conductive layers in the test structure that has no vias formed therein is detectable as a leakage current between the bonding pad of the test structure and a top most electrically conductive layer of the control structure.

10 Claims, 4 Drawing Sheets

US 6,998,638 B2

TEST STRUCTURE FOR DETECTING BONDING-INDUCED CRACKS

This patent application is a continuation of U.S. patent application Ser. No. 10/22,960 filed Aug. 28, 2002, which is now U.S. Pat. No. 6,781,150.

FIELD

This invention relates to the field of integrated circuit fabrication. More particularly, this invention relates to testing an integrated circuit for cracks under bonding pad structures.

BACKGROUND

Integrated circuits become more powerful as the number of devices within the integrated circuit increases. However, with this increase in the number of devices in an integrated circuit there also comes a general increase in the amount of surface area required to contain the integrated circuit on a substrate. As there is also a desire to generally reduce the size of integrated circuits, new techniques are continually required to both reduce the size of the devices within the integrated circuit and to otherwise place more devices within a given surface area.

One element of an integrated circuit that requires a relatively large amount of surface area is a bonding pad. This amount of required surface area is compounded by the typically large number of bonding pads required by an integrated circuit. It is therefore desirable to use the space underneath the surface area of a bonding pad for additional elements of the integrated circuit, such as active circuitry.

Unfortunately, the pressure that is placed upon a bonding pad during probing processes and wire bonding processes tends to crack underlying layers, which may fatally disrupt any active circuitry that is placed underneath the bonding pad. The problems caused by the cracks in these circumstances may not be detectable for some length of time, and thus the long term reliability of the integrated circuit so effected is reduced.

There is a need, therefore, for test structures that are able to detect cracking under bonding pad structures, so that such conditions can be quickly and easily identified so that faulty integrated circuits are not shipped, and process fixes can be implemented so that additional faulty integrated circuits are not produced.

SUMMARY

The above and other needs are met by an integrated circuit having a crack detection structure. A control structure is formed having interleaved electrically conductive layers and non electrically conductive layers in a vertical orientation. Electrically conductive vias are disposed vertically through all of the non electrically conductive layers, which vias electrically connect all of the electrically conductive layers one to another. A test structure is formed having a bonding pad for probing and bonding, with underlying interleaved electrically conductive layers and non electrically conductive layers disposed in a vertical orientation. At least one of the non electrically conductive layers has no vias formed therein, simulating active circuitry under other bonding pads of the integrated circuit. At least one of the interleaved electrically conductive layers of the control structure extends from within the control structure to within the test structure as a sensing layer. The sensing layer immediately underlies the at least one of the non electrically conductive layers in the test structure that has no vias formed therein. Thus, a crack in the at least one of the non electrically conductive layers in the test structure that has no vias formed therein is detectable as a leakage current between the bonding pad of the test structure and a top most electrically conductive layer of the control structure.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
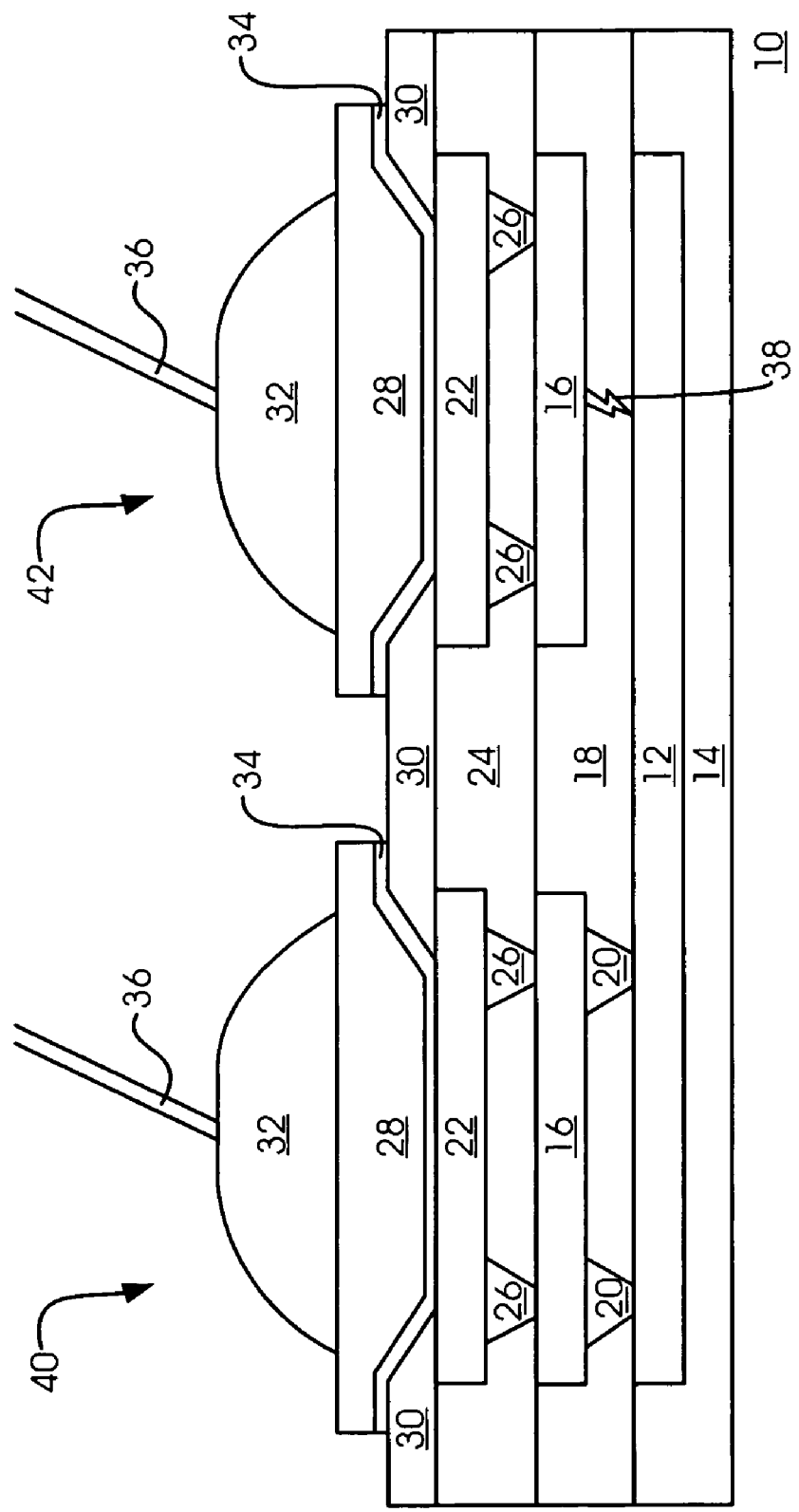
FIG. 1 is a cross sectional view of a vertical structure according to a first embodiment of the present invention.

With reference now to FIG. 1 there is depicted a cross sectional view of a portion of an integrated circuit 10, showing a vertical control structure 40 and a vertical test structure 42 according to a preferred embodiment of the present invention. The structures 40 and 42 are formed with different combinations of the layers that are next described, with the combinations as described thereafter. A first electrically conductive layer 12, such as may typically be called an M1 layer, is formed, most preferably of copper. The first electrically conductive layer 12 is preferably bounded by a non electrically conductive material 14, such as a low k material. Disposed on top of the first electrically conductive layer 12 is a first non electrically conductive layer 18, which is also preferably formed of a low k material.

A second electrically conductive layer 16 is disposed within the first non electrically conductive layer 18. The second electrically conductive layer 16 is one such as may typically be called an M2 layer, which is also most preferably formed of copper.

The first non electrically conductive layer 18 preferably has electrically conductive vias 20 that extend completely through the depth of the first non electrically conductive layer 18 and electrically connect the first electrically conductive layer 12 and the second electrically conductive layer 16.

Disposed on top of the second electrically conductive layer 16 is a second non electrically conductive layer 24, which is preferably formed of undoped silicate glass, called glass herein.

A third electrically conductive layer 22 is disposed within the second non electrically conductive layer 24. The third electrically conductive layer 22 is one such as may typically be called an M3 or top metal layer, which is also most preferably formed of copper. The second non electrically conductive layer 24 preferably has electrically conductive vias 26 that electrically connect the second electrically conductive layer 16 with the third electrically conductive layer 22.

The third electrically conductive layer 22 forms a bonding pad of the integrated circuit. Disposed on top of the third electrically conductive layer 22 is a fourth electrically conductive layer 34 that forms a diffusion boundary layer for the bonding pad of the third electrically conductive layer 22. Disposed on top of the fourth electrically conductive layer 34 is a capping layer 28 for the bonding pad, which is preferably formed of aluminum, and which is most preferably bounded by a non electrically conductive material 30, such as field oxide or passivation oxide.

On top of the capping layer 28 there is a wire bond 32 with associated wire 36, which provides for electrically continuity between the two structures 40 and 42 and outside circuitry, such as additional functional circuitry and test circuitry. However, at points in the processing of the integrated circuit 10 that are prior to that as depicted in FIG. 1, the structures 40 and 42 have not as yet been wire bonded, and the elements 32 and 36 would not as yet be present, but the structures 40 and 42 could nonetheless be electrically probed.

As is seen in FIG. 1, structure 40, which is a control structure, has vias 26 between the third electrically conductive layer 22 and the second electrically conductive layer 16, and vias 20 between the second electrically conductive layer 16 and the first electrically conductive layer 12. The vias tend to add structural support to the control structure 40, such that cracks tend to not occur in the non electrically conductive layers during probing or bonding. Even if cracking occurs, the damage cannot be detected electrically due to the presence of the vias 20 and 26.

However, structure 42, which is a test structure, has vias between the third electrically conductive layer 22 and the second electrically conductive layer 16, but does not have any vias 20 between the second electrically conductive layer 16 and the first electrically conductive layer 12. Thus, the pressure that is applied to the test structure 42 during probing and bonding processes may crack the first non electrically conductive layer 18, which is preferably formed of a relatively soft low k material. As the test structure 42 is designed to simulate those structures where active circuitry is formed in the layers underlying a bonding pad, it is desirable to be able to determine whether any such cracking occurs. In the embodiment depicted in FIG. 1, the first electrically conductive layer 12 extends contiguously between the control structure 40 and the test structure 42.

Active circuits, such as an input output cell, are preferably formed beneath other structures, which are not depicted, in at least one active circuit layer 12, which may comprise several layers. The active circuits are formed according to processes well known to those skilled in the art, such as semiconductor processing, and are electrically integrated with other active circuits in the integrated circuit according to well known methods. One purpose of the structure such as depicted in FIG. 1 is to provide a means whereby cracks in the various non electrically conductive layers which underlie the bonding pads can be quickly detected. If cracks are detected in the structure as depicted, then it is reasonable to assume that cracks are also present in the active devices that are under other bonding pads. Thus, such a situation can be quickly identified, and appropriate changes made so as to not ship the damaged devices, and to stop producing damaged devices.

According to a first embodiment of the structure of FIG. 1, the control structure 40 is used as a control pad and the test structure 42 is used the pad under test, specifically looking for cracks, such as crack 38, which may exist in the first non electrically conductive layer 18. Such a crack 38 is detectable as a leakage current between control structure 40 pin and the test structure 42 pin.

Figure 2:
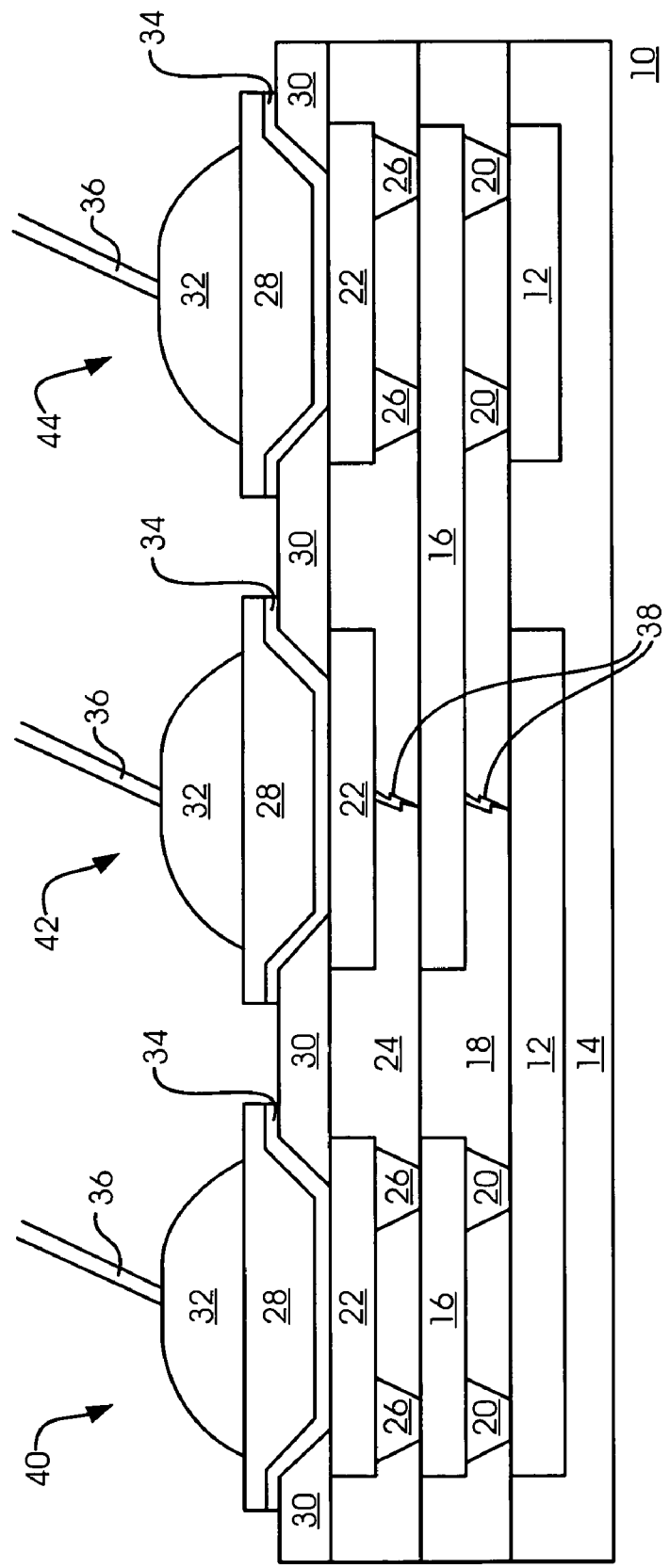
FIG. 2 is a cross sectional view of a vertical structure according to a second embodiment of the present invention.

In a second embodiment as depicted in FIG. 2, there is an additional control structure 44 added to the structure. The structure of FIG. 2 detects cracks 38 such as in the first non electrically conductive layer 18 and the second non electrically conductive layer 24. In this embodiment, the control structure 40 and the control structure 44 are used as control pads, and the test structure 42 is the pad under test. Cracking between the second electrically conductive layer 16 and the first electrically conductive layer 12 can be detected as a leakage current between the control structure 44 pin and the control structure 40 pin. Cracking between the second electrically conductive layer 16 and the third electrically conductive layer 22 is detectable as a leakage current between the test structure 42 pin and the control structure 44 pin.

Figure 3:
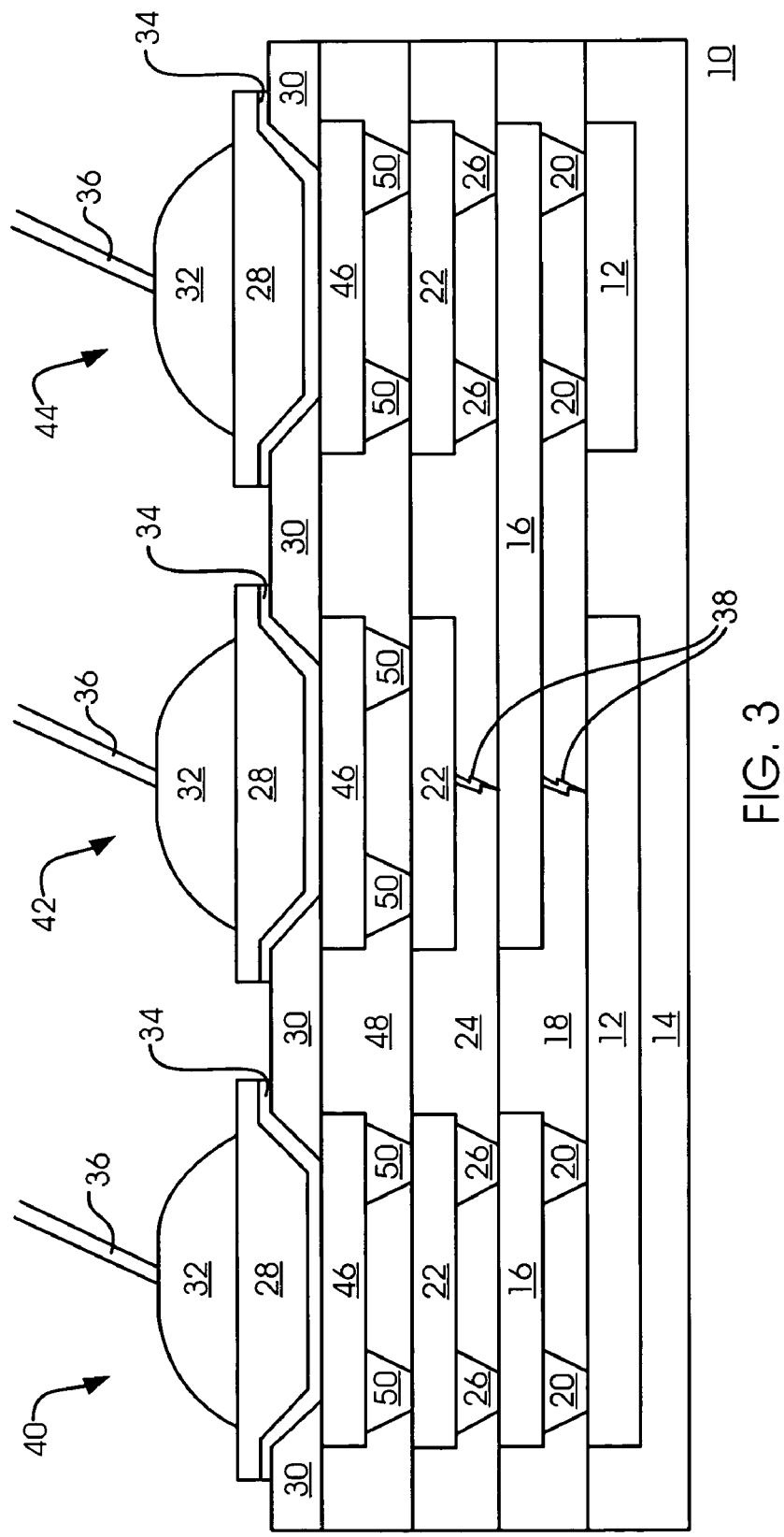
FIG. 3 is a cross sectional view of vertical structure according to a third embodiment of the present invention.

FIG. 3 depicts an embodiment where there is an additional third non electrically conductive layer 48, such as formed of glass, in which there is a fifth electrically conductive layer 46, such as is preferably formed of copper, which is electrically connected to the third electrically conductive layer 22 through electrically conductive vias 50, such as formed of copper. In the embodiment depicted in FIG. 3, a crack 38 disposed in the second non electrically conductive layer 24 is detected as a leakage current between the test structure 42 pin and the control structure 44 pin. A crack 38 disposed in the first electrically conductive layer 18 is detected as a leakage current between the control structure 40 pin and the control structure 44 pin.

Figure 4:
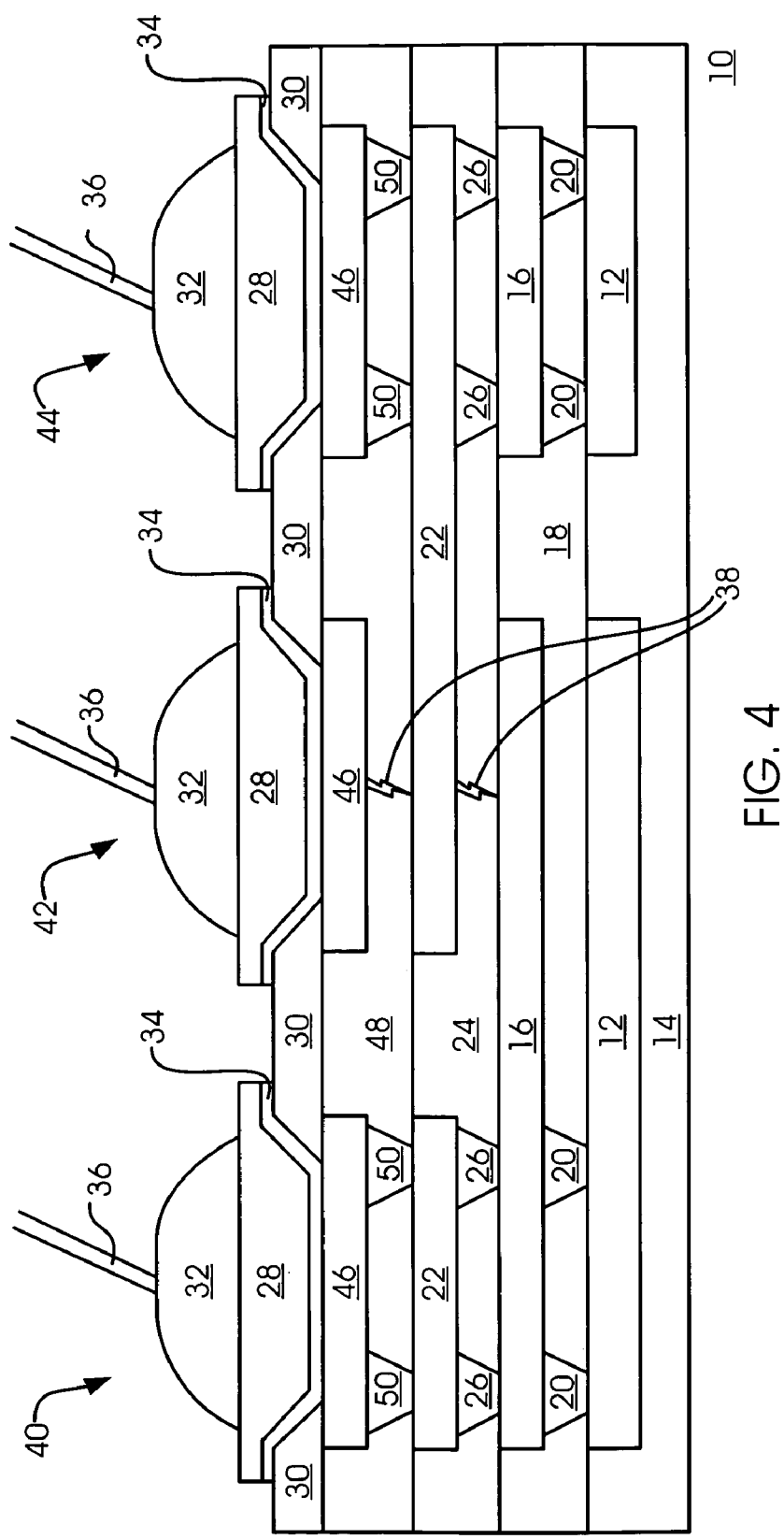
FIG. 4 is a cross sectional view of vertical structure according to a fourth embodiment of the present invention.

FIG. 4 depicts an embodiment where there is again an additional layer such as is described in regard to FIG. 3 above. Using the structure of FIG. 4, a crack 38 disposed in the third non electrically conductive layer 48 is detectable as a leakage current between the test structure 42 pin and the control structure 44 pin. A crack 38 disposed in the second non electrically conductive layer 24 is detectable as a leakage current between the control structure 40 pin and the control structure 44 pin.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit, the improvement comprising a crack detection structure having:

a control structure having interleaved electrically conductive layers and non electrically conductive layers in a vertical orientation, with electrically conductive vias disposed vertically through all the non electrically conductive layers and electrically connecting all of the electrically conductive layers one to another, where none of the electrically conductive layers of the control structure are electrically connected to any other structure besides the control structure, and all but one of the electrically conductive layers of the control structure do not extend outside of straight, vertical boundaries of the control structure, a test structure having a bonding pad for probing and bonding, the bonding pad including a lower electrically conductive layer, an upper capping layer, and a diffusion boundary layer disposed between the lower electrically conductive layer and the upper capping layer, and interleaved electrically conductive layers and non electrically conductive layers underlying the bonding pad in a vertical orientation, where at least one of the non electrically conductive layers has no vias formed in a region of the test structure, simulating active circuitry under other bonding pads of integrated circuit, where none of the electrically conductive layers of the test structure are electrically connected to any other structures besides the test structure, and none of the electrically conductive layers of the test structure extend outside of straight, vertical boundaries of the test structure, and the boundaries of the control structure and the test structure are mutually exclusive, and one of the interleaved electrically conductive layers of the control structure extends from within the control structure to within the test structure as a sensing layer, which is considered to be part of the control structure and not part of the test structure as claimed herein, where the sensing layer immediately underlies the at least one of the non electrically conductive layers in the test structure that has no vias formed therein, such that a crack in the at least one of the non electrically conductive layers in the test structure that has no vias formed therein is detectable as a leakage current between the bonding pad of the test structure and a top most electrically conductive layer of the control structure.

2. The integrated circuit of claim 1, wherein the top most electrically conductive layer of the control structure is a bonding pad.

3. The integrated circuit of claim 1, wherein the non electrically conductive layers of both the test structure and the control structure are formed of a low k material.

4. The integrated circuit of claim 1, wherein the non electrically conductive layers of both the test structure and the control structure are formed of glass.

5. The integrated circuit of claim 1, wherein the non electrically conductive layers of both the test structure and the control structure are formed glass and low k material.

6. The integrated circuit of claim 1, wherein the lower most ones of the non electrically conductive layers of both the test structure and the control structure are formed of a low k material and upper most ones of the non electrically conductive layers of both the test structure and the control structure are formed of glass.

7. The integrated circuit of claim 1, wherein the at least one of the non electrically conductive layers in the test structure that has no vias formed therein is formed of a low k material.

8. The integrated circuit of claim 1, wherein the electrically conductive layers of both the test structure and the control structure are formed of copper.

9. The integrated circuit of claim 1, wherein the sensing layer is a lower most one of the electrically conductive layers.

10. The integrated circuit of claim 1, wherein the at least one of the non electrically conductive layers in the test structure that has no vias formed therein is formed of glass.

* * * * *